United States Patent [19]

Cavada et al.

[11] Patent Number: 5,380,983
[45] Date of Patent: Jan. 10, 1995

[54] ELECTRICAL APPLIANCE HAVING USER PROXIMITY SENSOR

[75] Inventors: Luis O. Cavada, Bridgeport, Conn.; Joseph Carley, Ft. Wayne, Ind.; Leonard I. Horey, Shelton; Peter R. Hohlfeld, Oxford, both of Conn.

[73] Assignee: Black & Decker Inc., Newark, Del.

[21] Appl. No.: 90,914

[22] Filed: Jul. 12, 1993

[51] Int. Cl.⁶ .................. H03K 17/955; H03K 17/96; H05B 1/02
[52] U.S. Cl. ...................... 219/250; 219/251; 219/501; 219/481; 219/507; 340/562; 340/573
[58] Field of Search ............ 219/250, 251, 252, 481, 219/490, 497, 492, 499, 501, 506, 507; 340/561, 562, 573; 307/117

[56] References Cited

U.S. PATENT DOCUMENTS

| | | |
|---|---|---|
| 4,130,955 | 12/1978 | Baumgartner et al. |
| 4,168,443 | 9/1979 | Periot |
| 4,203,101 | 5/1980 | Towsend |
| 4,359,626 | 11/1982 | Potter ........................ 219/490 |
| 4,520,257 | 5/1985 | Schwob et al. |
| 4,641,132 | 2/1987 | Reger |
| 4,686,352 | 8/1987 | Nawrot et al. |
| 4,692,589 | 9/1987 | Borsari et al. |
| 4,727,240 | 2/1988 | Provolo et al. |
| 4,745,260 | 5/1988 | Albinger, Jr. et al. |
| 4,803,342 | 2/1989 | Steers et al. |
| 4,859,869 | 8/1989 | Heuwinkel et al. |
| 7,743,736 | 5/1988 | Albinger, Jr. et al. |

FOREIGN PATENT DOCUMENTS

| | | |
|---|---|---|
| 0127237 | 12/1984 | European Pat. Off. |
| 0290776 | 11/1988 | European Pat. Off. |
| 2627663 | 12/1977 | Germany |
| 228945 | 10/1985 | Germany |
| 4113487 | 11/1992 | Germany |
| 2054151 | 2/1981 | United Kingdom |
| 2199962 | 7/1988 | United Kingdom |
| 2205950 | 12/1988 | United Kingdom |
| 2260195 | 4/1993 | United Kingdom |

*Primary Examiner*—Mark H. Paschall
*Attorney, Agent, or Firm*—Barry E. Deutsch

[57] ABSTRACT

An electrical appliance, such as a pressing iron (10), includes a user proximity sensor for removing electrical power from the appliance after a period of non-use. When a user's hand is in close proximity to, or is in a grasping relationship with, a handle (28) of the pressing iron, an antenna (44) that is disposed within the handle is capacitively coupled to the user through a dielectric material that forms the handle wall. When so coupled to the user, a displacement current having a frequency equal to the AC line electrical power frequency signal (50 Hz or 60 Hz) is capacitively coupled between the user's body and the antenna. The displacement current is detected and amplified by circuitry (60) that is connected to the antenna by a conductor (46). This circuitry outputs a signal that indicates the proximity of the user to the handle of the pressing iron. The output signal is in turn employed to disable the operation of a time-out circuit (70). When the user is not in proximity to the handle of the pressing iron, the output signal is not generated and, after a predetermined time-out period, electrical power is automatically removed from a heating element (86) of the pressing iron.

17 Claims, 6 Drawing Sheets

ELECTRICAL APPLIANCE HAVING USER PROXIMITY SENSOR

FIELD OF THE INVENTION

This invention relates generally to automatic switching apparatus and, in particular, to automatic switching apparatus for use with electrical appliances.

BACKGROUND OF THE INVENTION

A concern when using an electrical appliance, such as an appliance having a heating element, is leaving the appliance unattended while it is operating. As such, it has been known to provide some appliances with an automatic shut-off feature that activates after some predetermined period of time of non-use of the appliance.

For example, commonly assigned U.S. Pat. No. 4,745,260, entitled "Automatic Switching Apparatus for an Electrical Appliance", by H. Albinger, Jr. et al., provides a motion sensor and an electronic timer to automatically shut off a pressing iron if the iron remains stationary for a predetermined period of time.

Also by example, commonly assigned U.S. Pat. No. 4,727,240, entitled "Electric Iron with Dual Automatic Cutoff", by D. J. Provolo et al., discloses an electric iron that employs two timing cycles for turning off power to the iron upon the absence of motion for two different discrete time periods. A motion sensor includes an attitude sensor to enable a short timing cycle for cutting off power after the electric iron is motionless with its sole plate in a substantially horizontal orientation. A longer timing cycle is enabled when the electric iron is motionless with its sole plate oriented in other than the horizontal detection range.

Both of the above referenced commonly assigned patents employ a mechanical or electromechanical apparatus to sense motion or lack of motion of the pressing iron.

Commonly assigned U.S. Pat. No. 4,743,736, entitled "Switching Apparatus for an Appliance Control Circuit", by H. Albinger, Jr. et al. discloses a switching apparatus useful with an electric iron control circuit. The control circuit is responsive to a movable contact member to generate a series of pulses for use by a microcomputer of an appliance control circuit to operate audible and visual status indicators.

The following U.S. Patents are cited for showing various types of switching arrangements for an electrical appliance.

U.S. Pat. No. 4,203,101, entitled "Electric Power Interrupting Apparatus" by Towsend, discloses a sensor controlled electric power interrupter for a pressing iron. A touch sensor senses hand skin contact and is attached to the handle of the iron. The sensor is a capacitance-controlled switching circuit that changes state when the capacitance of the body of the operator is connected to the circuit by the operator's hand skin contact. The sensor is used in conjunction with an orientation sensor (horizontal or vertical). In some embodiments a timer is employed, in conjunction with the orientation sensor, to shut off power to the iron after a predetermined period.

U.S. Pat. No. 4,520,257, entitled "Electronic Non-Use Power Interruption Safety Device for an Electric Flat-Iron" by Schwob et al., discloses a movable body contained within the housing of the iron for interrupting power at the end of a predetermined interval of non-use.

U.S. Pat. No. 4,130,955, entitled "Pressing or Smoothing Iron Comprising a Safety Turn-Off Means Located in a Heating Current Circuit" by Baumgartner et al., discloses the use of an acceleration sensor comprised of a ball located in a curved channel within the body of an iron. When the pressing iron is left lying motionless on the goods being ironed, disconnection of electric power occurs after a predetermined period of time.

U.S. Pat. No. 4,859,869, entitled "Safety Switching Means for Controlling a Current Consumer" by Heuwinkel et al., discloses the use of an optical transmitter and receiver to detect the presence of the user's hand upon the handle of a pressing iron. A position-responsive sensing device (mercury switch) is employed with the optical sensor such that, when the iron is in a horizontal working position, the heater current is influenced only by the optical sensor.

U.S. Pat. No. 4,686,352, entitled "Electronic Pressing Iron" by Nawrot et al., discloses an electric pressing iron that includes a motion and attitude sensor that is connected to a timer to disable the electric heater of the iron depending on iron orientation and movement.

U.S. Pat. No. 4,692,589, entitled "Electric Iron Having Safety Cutoff Switch and Temperature Indicator" by Borsari et al., discloses an electric iron having an orientation-detecting switch and a timing circuit which, after the iron is unmoved in the horizontal or vertical position for preset times, triggers a manually resettable thermostatic cutoff switch.

U.S. Pat. No. 4,803,342, entitled "Flat-Iron Safety Device Utilizing a Dual Internal Timing Circuit" by Steers et al., discloses the use of a pivotally mounted magnet for sensing orientation of the iron. A dual interval timing circuit provides first and second timing intervals for interrupting electric current to the iron.

In general, the above referenced patents require the use of a mechanical-type orientation or motion sensor, or require a combination of sensors, such as an optical sensor with an orientation sensor, to provide power control in an electrical appliance. As can be appreciated, sensors that employ a moving element are subject to failure. Furthermore, when constructing consumer appliances, a desirable goal is to reduce both cost and complexity. As such, the use of a plurality of sensors can result in higher cost and complexity.

The following two U.S. Patents are cited for showing switching circuits.

U.S. Pat. No. 4,641,132, entitled "Condition-Responsive Switching Circuit" by Reger discloses the diversion of power when a detecting circuit senses a change in a condition being monitored.

U.S. Pat. No. 4,168,443, entitled "Two-Wire Proximity Detector" by Periot discloses a proximity sensor that includes a probe having an output that is sensed by circuitry for triggering a thyristor.

OBJECTS AND SUMMARY OF THE INVENTION

It is thus one object of this invention to provide an electrical appliance having an automatic power interrupter that does not require any moving parts.

It is another object of this invention to provide a low cost and non-complex sensor for detecting the proximity of a user to an electrical appliance without requiring physical contact with any electrically conductive parts.

It is another object of this invention to provide a power interrupter for an electrical appliance that includes a low cost and non-complex user proximity sensor, and which furthermore does not require the presence of another type of sensor, such as an orientation sensor or a motion sensor.

It is another object of this invention to provide a sensor for detecting the proximity of a user to an electrical appliance, and to also provide a sensor power supply topology that provides reliable proximity detection without regard for a polarization of the AC hot and AC neutral power input leads.

It is another object of this invention to provide an electric pressing iron having a user proximity sensor contained within a handle thereof, the user proximity sensor providing an output to a time out circuit that provides one predetermined time out period for removing electrical power from a heating element of the electric pressing iron.

A still further object of this invention is to provide an electric pressing iron having a user proximity sensor that reacts to the presence of a user's hand by detecting a small displacement current that flows between the hand and the sensor.

The foregoing and other problems are overcome and the objects of this invention are realized by an electrical appliance, for example a pressing iron, that is constructed and operated in accordance with this invention.

When a user's hand is in close proximity to, or is in a grasping relationship with, a handle of the pressing iron, an antenna that is disposed within the handle is capacitively coupled to the user through a dielectric material that forms the wall of the handle. When so coupled to the user, a minuscule displacement current flows between the user's hand and the antenna. The effect of the displacement current is detected and amplified by circuitry that is connected to the antenna by a conductor. The amplifier circuitry outputs a signal that indicates the proximity of the user to the handle of the pressing iron. The output signal is in turn employed to disable the operation of a time-out circuit. When the user is not in proximity to the handle of the pressing iron, the output signal is not generated and, after a predetermined time-out period, electrical power is automatically removed from a heating element of the pressing iron.

Further in accordance with this invention reliable proximity sensing is achieved through a sensor power supply topology or configuration wherein a half wave rectifier diode is positioned in series between an AC main and circuit ground, thereby causing the sensor amplifier circuitry to reliably operate without regard for a polarization of the AC power hot and neutral lines.

BRIEF DESCRIPTION OF THE DRAWINGS

The above set forth and other features of the invention are made more apparent in the ensuing Detailed Description of the Invention, when read in conjunction with the attached Drawings, wherein:

FIG. 7b illustrates exemplary waveforms obtained at the nodes A and B of FIG. 7a;

FIGS. 9a and 9b through 9e are each a simplified schematic diagram, wherein FIG. 9a illustrates a first placement of a half wave rectifier diode, and wherein FIGS. 9b through 9e illustrate a preferred placement of the half wave rectifier diode.

DETAILED DESCRIPTION OF THE INVENTION

Figure 1:
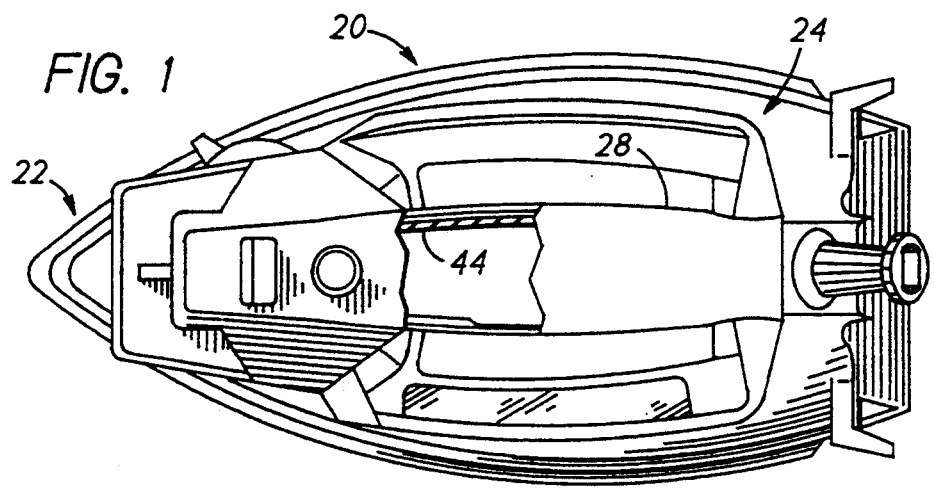
FIG. 1 is a top plan view, certain parts being cut away, illustrating an electrical appliance in the form of a pressing iron that embodies this invention.
Figure 2A:
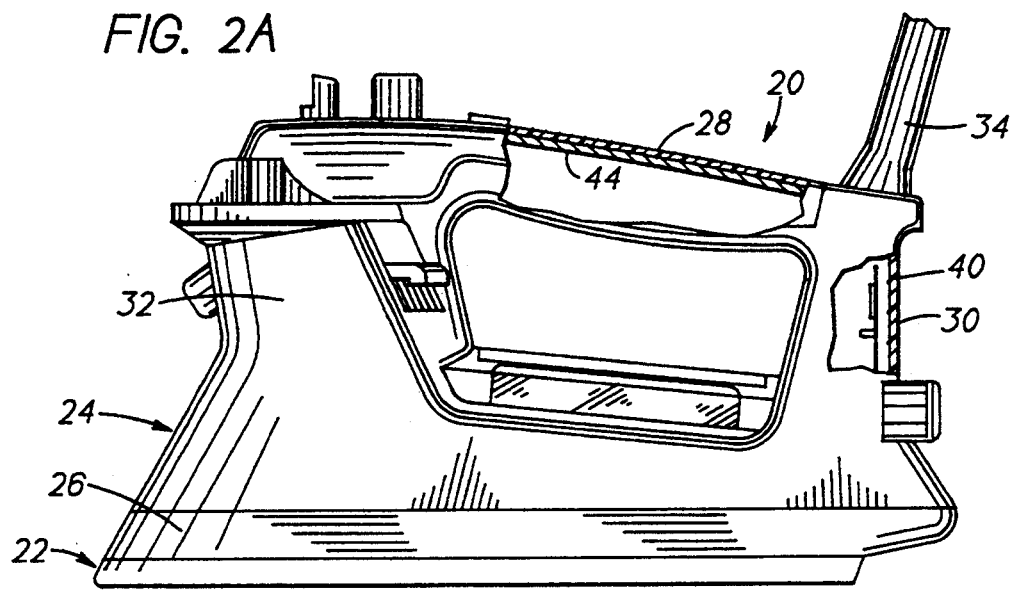
FIG. 2A is a side elevational view, certain parts being cut away and in section, of the pressing iron of FIG. 1.

FIGS. 1 and 2A illustrate an electric pressing iron 20 which includes a sole plate 22, typically of cast aluminum, on which is mounted a housing 24, typically of molded plastic. The housing 24 includes a bottom portion or skirt 26 and a handle portion 28 connected by a rear pedestal or heel portion 30 and a throat 32. Extending from the rear of the handle portion 28 and the top of the pedestal 30 is a line cord 34 for connecting the iron 20 to a source of electrical power. The pedestal 30 includes a circuit board 40 having electrical and electronic circuitry for controlling the operation of the iron 20. A number of user controls including a temperature selector knob, steam actuator, and steam control button may be provided on the housing 24, but constitute no part of the present invention and thus are not discussed in any detail.

Figure 2B:
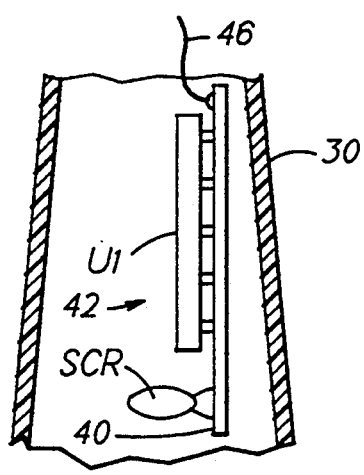
FIG. 2B is a side cross sectional view that shows a heel portion of the electrical appliance in greater detail.

FIG. 2B illustrates a portion of the pedestal 30 in greater detail. Contained within the pedestal 30 is the circuit board 40 having electronic circuitry, such as an integrated circuit U1 and silicon controlled rectifier (SCR).

Figure 3:
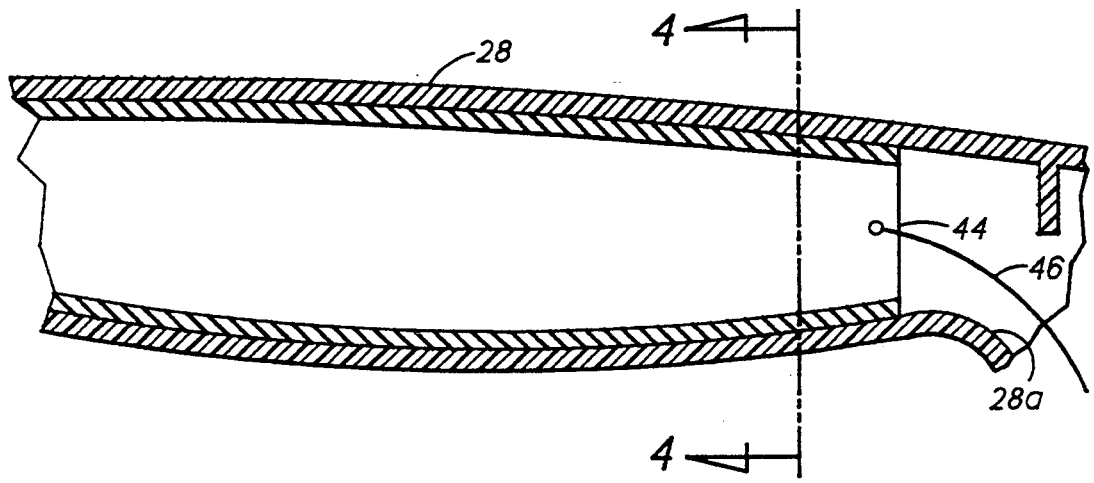
FIG. 3 is a detail elevation cross section view illustrating a portion of the appliance depicted in FIGS. 1 and 2A.
Figure 4:
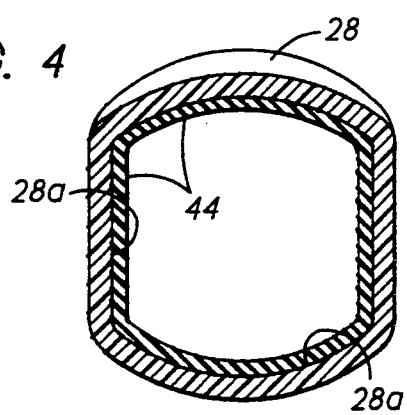
FIG. 4 is a cross section view taken across the section line 4—4 of FIG. 3.

FIGS. 3 and 4 illustrate a portion of the handle 28 in greater detail. In accordance with this invention the handle 28 includes an electrically conductive member that functions in a manner that is analogous to the plate of a capacitor. The electrically conductive member is referred to herein as an antenna 44. Antenna 44 has, in this embodiment of the invention, a shape that substantially conforms to at least a portion of an inner surface 28a of the handle 28. Preferably, the antenna 44 extends along a length of the inner surface 28a of the handle 28 within a region that is grasped by the hand of the user of the iron 20. Referring also to FIG. 2B, a conductor, shown as a wire 46, is employed to electrically connect the antenna 44 to amplifier circuitry 42 that is disposed upon the circuit board 40 within the pedestal 30.

In accordance with an aspect of this invention, when a user's hand is in close proximity to, or is in a grasping relationship with, the handle 28 of the pressing iron 20, the antenna 44 that is disposed within the handle 28 is capacitively coupled to the user through a dielectric material that forms the wall of the handle. When so coupled to the user, a minuscule displacement current flows between the user's hand and the antenna 44. The effect of the displacement current is detected and amplified by the circuitry 42 that is connected to the antenna 44 by the conductor 46. The amplifier circuitry 42 outputs a signal that indicates the proximity of the user to the handle 28 of the pressing iron 20. The output signal is in turn employed to disable the operation of a time-out circuit. When the user is not in proximity to the handle 28 of the pressing iron 20, the output signal is not generated and, after a predetermined time-out period, electrical power is automatically removed from a heating element of the pressing iron 20.

As employed herein, a displacement current is considered to be a current which exists in addition to an ordinary conduction current in an AC circuit. The magnitude of a displacement current is proportional to a rate of change of the electric field.

Figure 5:
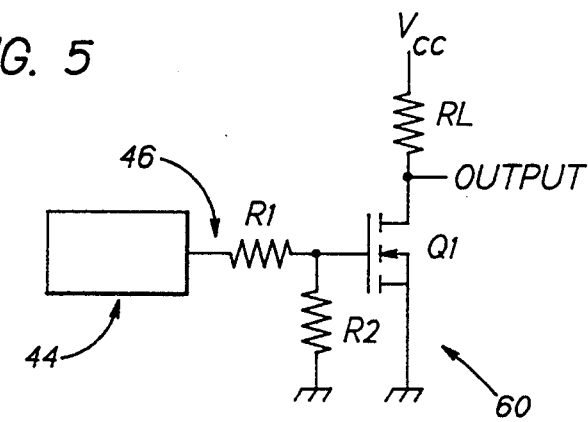
FIG. 5 is a schematic diagram illustrating an embodiment of a user proximity detection circuit that forms a portion of the appliance shown in FIGS. 1-4.

FIG. 5 illustrates the presently preferred planar antenna 44 embodiment of FIGS. 3 and 4, wherein the antenna 44 is coupled through wire 46 to an embodiment of electrical circuit 60 for receiving and amplifying the ambient power frequency signal. In this embodiment resistors R1 and R2 form a voltage divider having a tap connected to the gate of enhancement mode MOSFET (Q1). An output of Q1 is coupled to the load resistance RL, providing a signal of substantially greater magnitude than the input signal. If the input signal is sufficiently large, the output signal will appear as a square wave with a frequency equal to that of the signal coupled into antenna 44. R1 and R2 are provided to reduce the sensitivity of the gate of Q1 to spurious noise. As sensitivity is increased, the presence of a user may be detected at a greater distance, though amplifier sensitivity is not the sole determinant of reliable detection distance. In general, the value of R2 should be sufficiently small so that leakage current does not raise the gate potential of Q1 to a level that allows Q1 to conduct. The value of R2 should also be selected such that the charge can be bled from the input capacitance within a reasonable amount of time.

Figure 6:
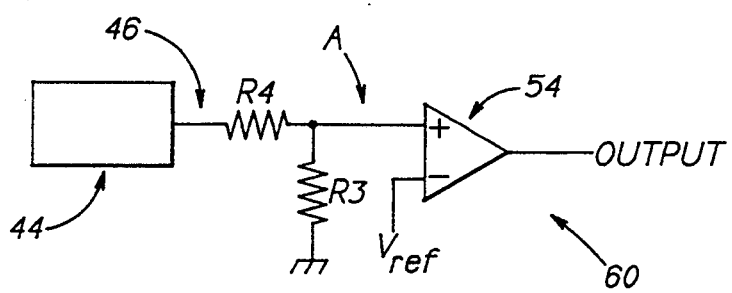
FIG. 6 is a schematic diagram illustrating another embodiment of the user proximity detection circuit that forms a portion of the appliance shown in FIGS. 1-4.

FIG. 6 illustrates the presently preferred planar antenna 44 embodiment of FIGS. 3 and 4, wherein the antenna 44 is coupled through wire 46 to the presently preferred embodiment of electrical circuit 60. In this embodiment resistors R3 and R4 form a voltage divider having a tap connected to an input of a voltage comparator 54. The other input to the voltage comparator is connected to a reference voltage thereby establishing a detection threshold. If the energy appearing at the comparator input A exceeds the reference voltage, the comparator output toggles from a low voltage to high voltage condition. Presently preferred values of R4 and R3 are approximately $20 \times 10^6$ ohms and $500 \times 10^3$ ohms, respectively.

The antenna 44 is preferably comprised of a high conductivity layer of metal or metalization, such as copper or aluminum. In one embodiment a thin sheet of copper foil is interposed between two thin sheets of electrically insulating dielectric material, such as MYLAR. The resulting structure is sufficiently pliable so as to be conformed to the shape of the inner surface 28a of the handle 28. If desired, a rigid metallic plate comprised of, by example, copper or aluminum can be stamped or otherwise formed into the desired shape.

Figure 7A:
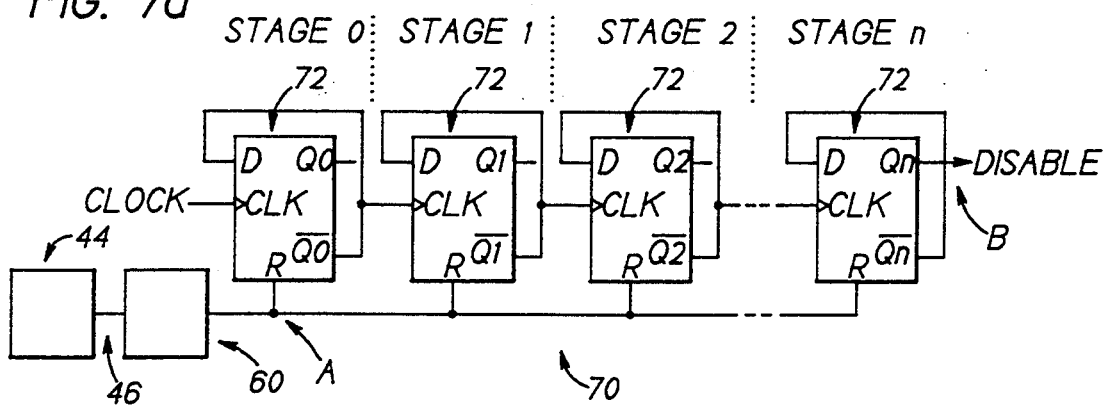
FIG. 7a is a schematic diagram, partly in block diagram form, that illustrates the user proximity detection circuit of FIG. 6 coupled to a time out circuit embodied as a multi-stage counter.
Figure 7B:
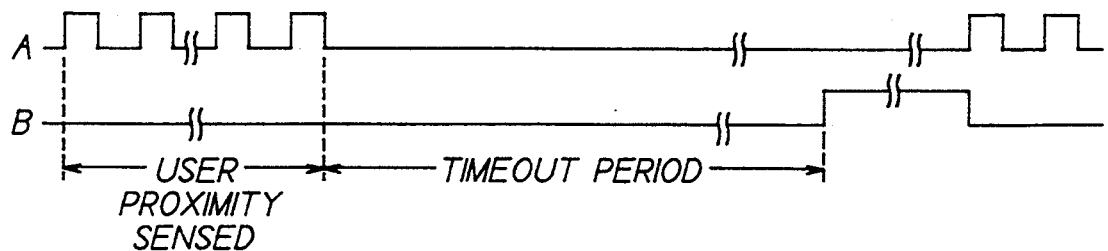

FIG. 7a illustrates the antenna 44, wire 46, and circuitry 60 of FIG. 6 coupled to a time out circuit 70. Time out circuit 70 includes an n-stage counter (Stage 0-Stage n) that is comprised of n flip-flops 72. In this embodiment, and is as shown in FIG. 7b, the output of circuit 60 is nominally a square wave when user proximity is sensed. When user proximity is not sensed, the output of circuit 60 is a logic zero. The output of circuit 60 is coupled to the reset (RST) inputs (active low) of counter flip-flops 72. As such, when user proximity is sensed the periodic toggling, between logic zero and logic one, of the signal at node A serves to periodically reset the counter flip-flops 72. However, when user proximity is not sensed the signal at node A goes to a logic zero, thereby removing the reset condition from the counter flip-flops 72. The counter flip-flops 72 are then enabled to count a clock signal (CLOCK). A number of counter stages are provided so as to provide, in conjunction with the frequency of the CLOCK signal, a desired time out period before the output of Stage n is asserted. The assertion of the output of Stage n generates a DISABLE signal which is employed, as described below, to remove electrical power from the heating element of the iron 20.

By example, in a presently preferred embodiment of the invention the CLOCK signal is received from the input power frequency (50/60 Hz), and a number of ripple counter stages are employed so as to provide a time out period of approximately 10 minutes. In other embodiments of the invention, the asynchronous ripple counter stages could be replaced by, for example, synchronous counters, or by a serial shift register that shifts a bit in response to CLOCK, or an integrated circuit RC timer that does not require the CLOCK signal.

Figure 8:
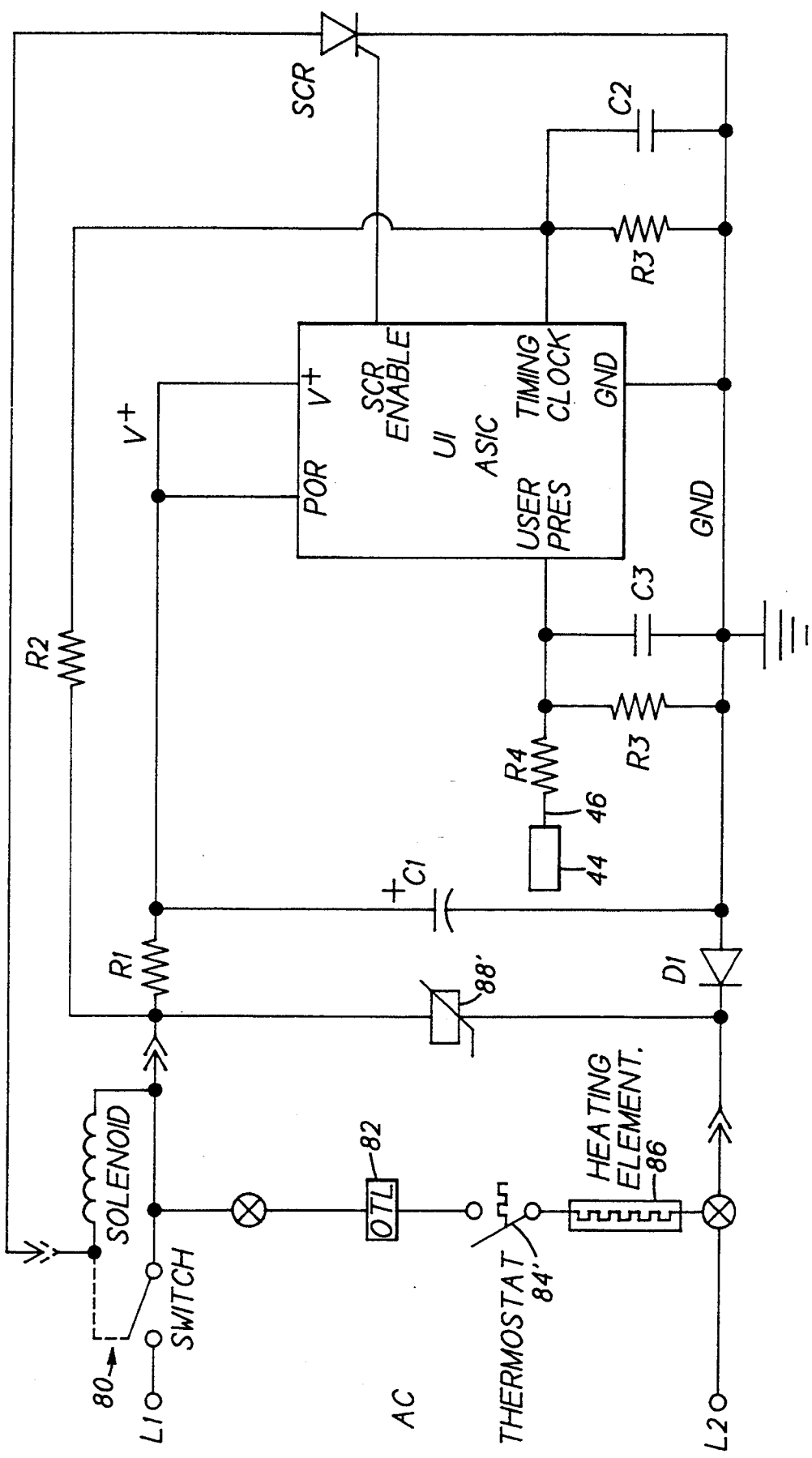
FIG. 8 is a simplified schematic diagram of a pressing iron that is constructed in accordance with this invention.

FIG. 8 illustrates an embodiment of the invention wherein the circuits 60 and 70 are contained within an Application Specific Integrated Circuit (ASIC) that is designated U1. U1 is mounted on the circuit board 40 as depicted in FIG. 2B, as is the SCR that is controlled by U1.

Electric power lines L1 and L2 are conveyed by power cord 34 and connect the iron 20 to the house AC wiring. L1 is coupled through a solenoid-controlled on/off switch 80 to an over temperature limiter (OTL) 82. The OTL 82 is connected in series with a user settable thermostat 84 and a heating element 86. When switch 80 is closed, the heating element 86 warms the sole plate 22 to the temperature indicated by the thermostat 84. The OTL 82 is thermally coupled to the sole plate 22 and functions to permanently open the heater circuit should an over-temperature condition occur.

Connected between L1 and L2 is a Metal Oxide Varistor (MOV) 88 that functions as a surge suppressor. A DC power supply for U1 is comprised of a half wave rectifier diode D1, filter capacitor C1, and current limiting resistor R1. The DC power is applied to a V+ terminal of U1, and a ground (GND) terminal of U1 is connected to circuit ground. The DC power is also applied to a Power On Reset (POR) within U1, and thence to a conventional circuit (not shown) that applies a master reset signal to the circuitry within U1 whenever the DC voltage transitions from off to on.

R2 and R5 form a voltage divider from which a 60 Hz or 50 Hz signal is obtained from the input AC power and provided to a TIMING CLOCK input of U1. This input of U1 corresponds to the CLOCK signal shown in FIG. 7a. C2 bypasses high frequency noise from the TIMING CLOCK signal to prevent errant counting of the counter chain (FIG. 7a) that is contained within U1.

In accordance with this invention the antenna 44 is connected via wire 46 to resistors R4 and R3 and, thence, to a USER PRESENCE input of U1. The USER PRESENCE input is coupled to the counter chain as depicted in FIGS. 6 and 7a, or to equivalently operating circuitry, that is contained within U1. Capacitor C1, in conjunction with resistors R3 and R4, forms a low pass filter which decreases input sensitivity to high frequencies. U1 also includes an SCR ENABLE output that is coupled to the output of Counter Stage n, as depicted in FIG. 6.

This circuitry functions as previously described to maintain the SCR in an off condition so long as user proximity is sensed, and also for a predetermined period of time after user proximity is not sensed. When user proximity is not sensed, and the counter chain times out, the SCR is turned on which, in turn, disconnects L1 from the heating element 86 via solenoid/switch 80. If user proximity is sensed prior to time-out but following a period of non-proximity, the counter stages are reset, thereby maintaining the SCR in an off condition. Once a time out has occurred, and AC power is disconnected, no further operation of U1 is possible without the user activating the power switch.

It is noted that the placement of D1 shown in FIG. 8 is a presently preferred placement that ensures reliable operation of the user proximity sensor of this invention under various conditions of house wiring and electrical plug connection to the house wiring.

Reference is now made to FIGS. 9a through 9e to better explain this presently preferred placement of the half wave rectifier diode D1. In FIGS. 9a through 9e the amplifier input is located at the junction of diodes D2 and D3. Also in FIGS. 9a through 9e, the 6.2 V zener diode (REG) may be contained within U1 for providing the appropriate DC potential for operating the logic circuitry within U1. The remainder of the components are numbered as shown in FIG. 8.

Figure 9A:
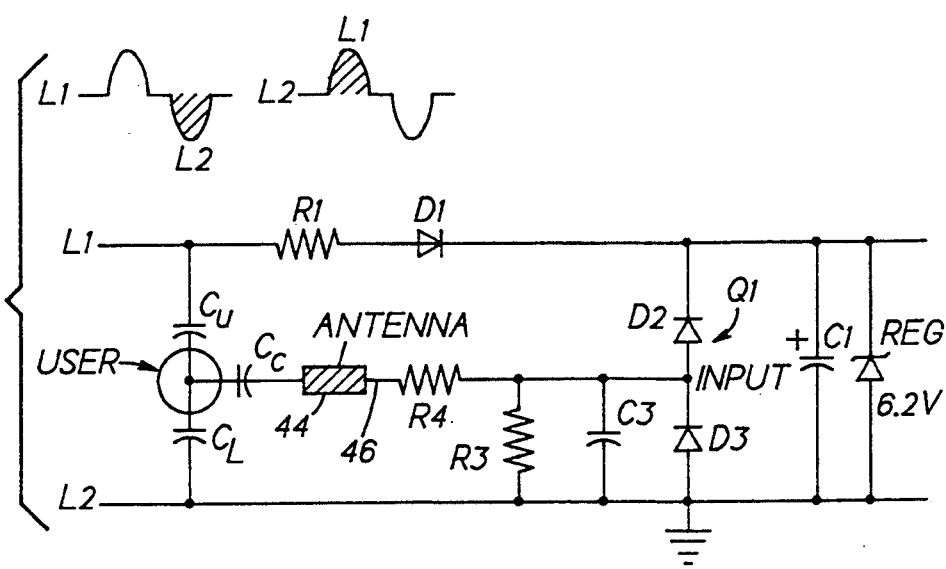

It has been determined that the design of the power supply for the user proximity circuit is an important consideration. The typical construction of a power supply is shown in FIG. 9a. When using the typical power supply construction, the user is coupled to the proximity circuit through the equivalent capacitances $C_U$, $C_L$, and $C_C$. $C_C$ remains constant at approximately 8-15 pF, simulating the coupling capacitance between the user's hand and the antenna 44. $C_U$ and $C_L$ represent the user's body capacitance to earth ground and AC neutral, and AC hot. It is noted that earth ground and AC neutral are virtually equal in potential, and that the user's capacitance to earth ground is greater than the capacitance to either L1 and L2. It is further noted that only a positive signal at the input to the amplifier circuit results in a detection of the proximity of the user.

In FIG. 9a, when L1 is AC neutral and L2 is AC hot, $C_U$ is much larger than $C_L$. Thus, during the negative half cycle of the AC voltage (i.e., L1 is positive with respect to L2), a sufficiently large positive signal is generated (with respect to circuit ground) at the antenna 44, and the proximity detection circuit senses the user.

With L1 at AC neutral and L2 at AC hot, during the positive half cycle (i.e., when L2 is positive with respect to L1) the voltage division effected by $C_U/C_L$, combined with the clamping effect of D3 and the bias condition of the amplifier all contribute to conditions whereby the amplifier input voltage is inappropriate for detection.

However, in FIG. 9a when L1 is AC hot and L2 is AC neutral, $C_L$ is much larger than $C_U$. This results in only a very small positive signal (if any) to exist during the positive half AC cycle (i.e., when L1 is positive with respect to L2) at the antenna 44, with respect to circuit ground. With L1 hot and L2 AC neutral, during the negative half cycle of the AC line voltage the operation is analogous to that described above for the positive half cycle (with L2 hot and L1 neutral).

As a result, the proximity detection circuit may not sense the user, making AC polarization essential. However, AC polarization can be defeated either intentionally or inadvertently by the user. Furthermore, the use of AC polarization assumes that the house wiring conforms to code, which may not always be the case.

To overcome this potential problem, it has been determined that moving D1 to the location as shown in FIGS. 9b-9e (and also FIG. 8) alleviates the need for observing AC polarization.

Figure 9B:
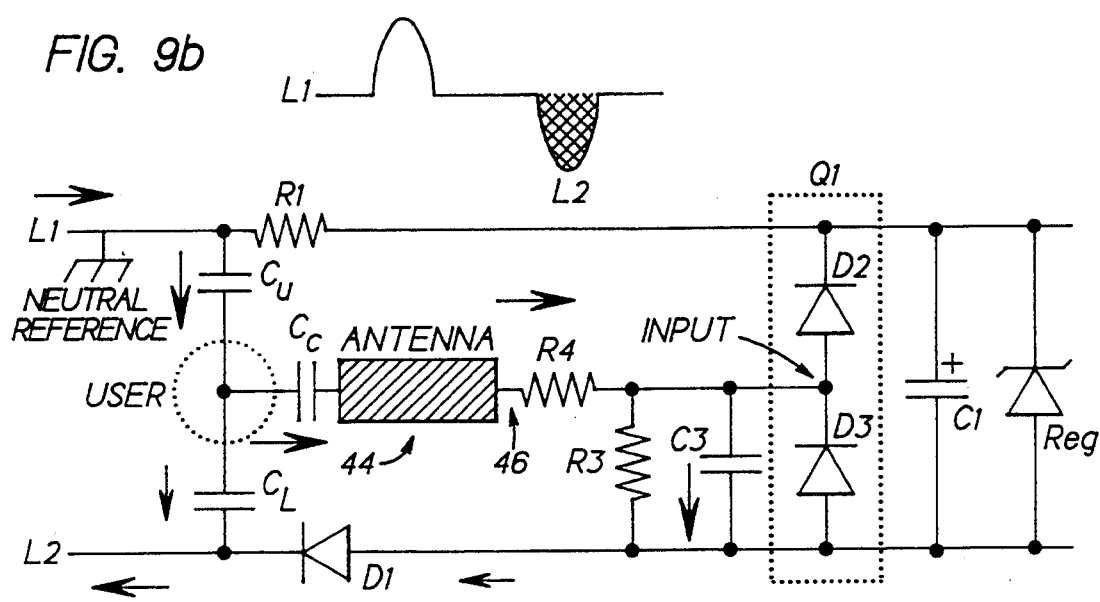
Figure 9C:
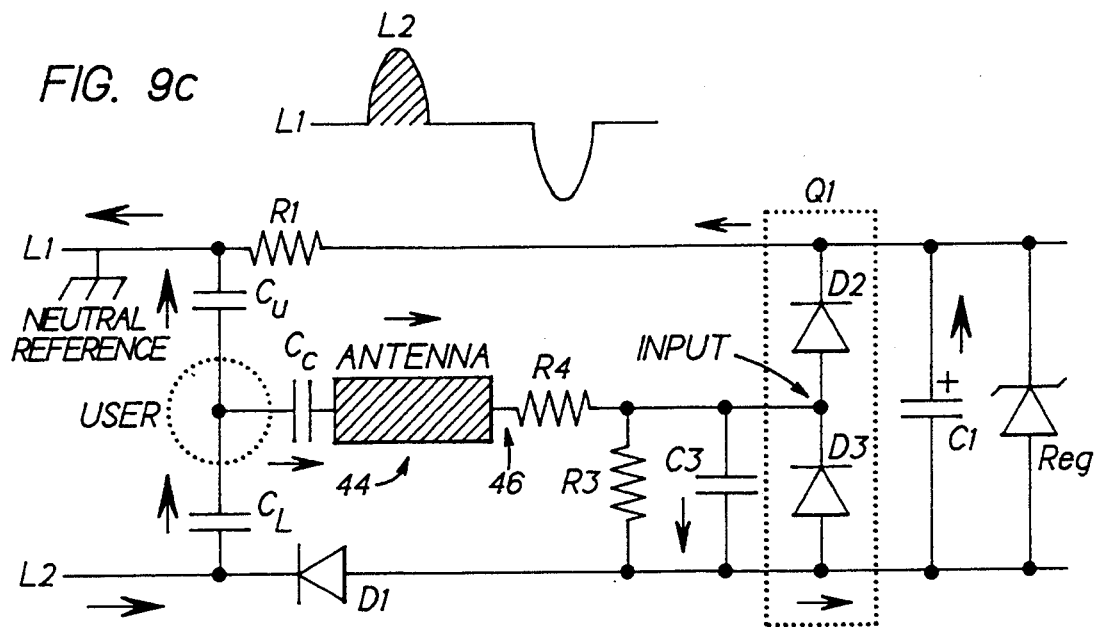

In FIGS. 9b and 9c, when L1 is AC neutral and L2 is AC hot, $C_U$ is much larger than $C_L$. During the negative ½ cycle, when the potential of L1 is greater than L2, the maximum energy is delivered to the amplifier circuitry. Unlike the configuration in FIG. 9a, some energy, albeit less than maximum, is delivered during the positive ½ cycle, when L2 is greater than L1.

Figure 9D:
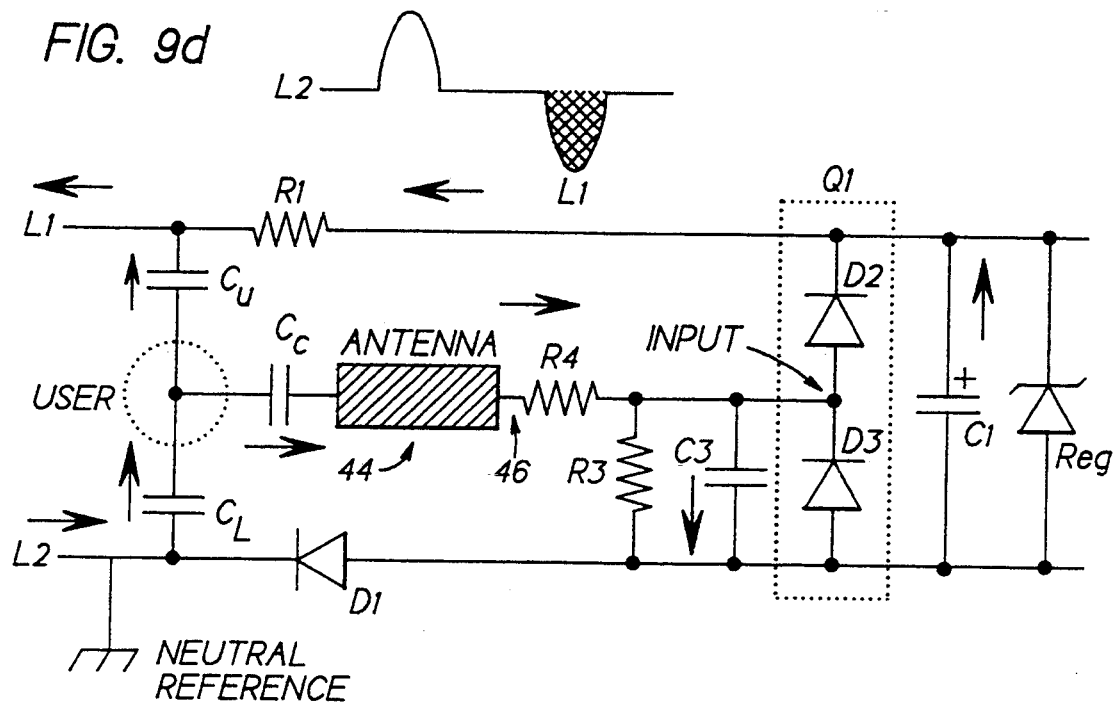
Figure 9E:
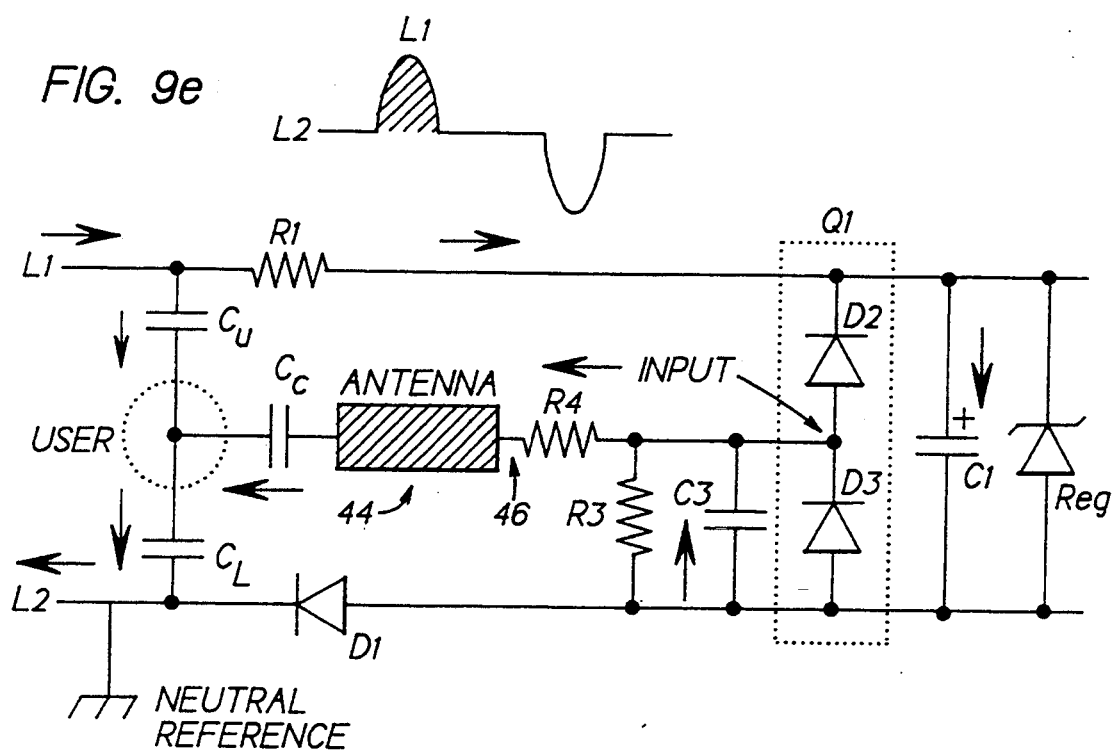

When, in FIG. 9d and 9e, L1 is AC hot and L2 is AC neutral, $C_L$ is much larger than $C_U$. During the negative ½ cycle, when the potential of L2 is greater than L1, a sufficiently strong signal appears at the amplifier input and, due to the location of $D_1$, this signal is caused to be positive with respect to circuit (DC) ground. During the positive ½ cycle, when the potential of L1 is greater then L2, some energy, albeit less than maximum, is still delivered.

As a result, the user is detected regardless of the polarization of the AC line voltage.

In the practice of this invention, the choice of materials, circuits, fabrication methodologies and the like is a function of cost and other criteria. It should thus be kept in mind that, although this invention is described herein with respect to presently preferred embodiments thereof, the teaching of this invention is not intended to be limited to only these disclosed embodiments. For example, the antenna 44 could be comprised of any suitably electrically conductive metal, metal alloy, or polymer. Also by example, the antenna 44 can be given any suitable shape so long as it is accommodated within the inner volume of the handle 28. Further by example, the antenna 44 could be embodied in a layer of metalization that is applied directly to the inner surface 28a of the handle 28.

It should also be appreciated that the teaching of this invention is not limited for use only with pressing irons, or for use only with electrical appliances that include heating elements. By example only, the teaching of this invention can be employed with a vacuum cleaner to remove power from the motor when the user releases the hose/nozzle assembly of a canister-type vacuum, or the handle of an upright-type or small, hand-held type of vacuum. The teaching of this invention can also be employed to advantage with power tools, such as sanders, drills, and saws, to remove motor power if the user releases the handle.

It should also be realized that this invention can be used in conjunction with other types of sensors, such as motion and/or orientation sensors, if so desired.

Thus, while the invention has been particularly shown and described with respect to both exemplary and presently preferred embodiments thereof, it will be understood by those skilled in the art that changes in form and details may be made therein without departing from the scope and spirit of the invention.

What is claimed is:

1. A proximity sensor for use in an electrically operated appliance, the proximity sensor including:
   an antenna for coupling a displacement current from a user of the appliance, said antenna having an output; and
   circuit means having an input coupled to said output of said antenna, said circuit means generating an output signal at an output thereof in response to a reception of the displacement current, said output signal of said circuit means is an oscillatory signal having a frequency equal to an AC line power frequency.

2. A proximity sensor as set forth in claim 1 wherein said antenna is disposed for being capacitively coupled to the user's body.

3. A proximity sensor as set forth in claim 1 and further comprising switching means having an input coupled to said output of said circuit means, said switching means being responsive to said circuit means generating said output signal for being switched from a first state to a second state, said switching means further being responsive to said circuit means ceasing to generate said output signal for being switched from the second state to the first state.

4. A proximity sensor as set forth in claim 3 wherein said switching means includes means for delaying the switching from the second state to the first state for a predetermined period of time after said receiver ceases to generate said output signal.

5. A proximity sensor as set forth in claim 4 wherein said delaying means includes timer circuit means having an input coupled to said output signal of said circuit means, said timer circuit means having an output for providing an output signal, and wherein said timer circuit means is responsive to said output signal of said circuit means for providing the output signal a predetermined period of time after said circuit means ceases to generate the output signal at the receiver output.

6. A proximity sensor as set forth in claim 1 wherein the appliance includes an outer wall, wherein said antenna is comprised of an electrically conductive member, and wherein said outer wall is disposed between said electrically conductive member and a portion of the appliance that is normally touched by the user during the use of the appliance.

7. A proximity sensor as set forth in claim 6 wherein said electrically conductive member has a shape which substantially conforms to an inner surface shape of said outer wall.

8. A proximity sensor as set forth in claim 6 wherein said electrically conductive member is disposed within a handle portion of the appliance, the handle portion being a portion of the appliance that is grasped by the user during the use of the appliance.

9. An electrical appliance, said appliance including means for sensing a proximity of a person to the appliance and for removing electrical power from at least a portion of said appliance after a predetermined period of non-use of said appliance, wherein said sensing and removing means operates without regard for a motion of said appliance and without regard for an orientation of said appliance, said means for sensing and removing comprising:
   an antenna for coupling a displacement current from a user of the appliance, said antenna having an output; and circuit means having an input coupled to said output of said antenna, said circuit means generating an output signal at an output thereof in response to a reception of the displacement current, said antenna being disposed for being capacitively coupled to the user's body, said output signal of said circuit means is an oscillatory signal having a frequency equal to an AC line power frequency signal.

10. An electrical appliance as set forth in claim 9 wherein said means for sensing and removing further includes power switching means having an input coupled to said output of said circuit means, said power switching means being responsive to said circuit means generating said output signal for being switched from a first state to a second state, said power switching means further being responsive to said circuit means ceasing to generate said output signal for being switched from the second state to the first state, wherein said switching means includes means for delaying the switching from the second state to the first state for a predetermined period of time after said circuit ceases to generate said output signal.

11. A pressing iron, comprising:
   a sole plate;
   an electrically powered heating element that is thermally coupled to said sole plate for heating said sole plate for heating said sole plate to a desired temperature; and
   a handle portion adapted for being held by a user of the pressing iron, said handle portion including a user proximity sensor comprising,
   an antenna for coupling a displacement current between the user and said antenna, said antenna having an output;
   circuit means having an input coupled to said output of said antenna, said output signal of said circuit means is an oscillatory signal having a frequency equal to an AC line power frequency signal said circuit means generating said output signal at an output thereof in response to the coupling of the displacement current between the user and said antenna; and
   switching means having an input coupled to said output of said circuit means, said switching means being responsive to said circuit means generating said output signal for being switched from a first state to a second state for applying electrical power to said heating element, said switching means further being responsive to said circuit means ceasing to generate said output signal for being switched, after a predetermined interval of time, from the second state to the first state for removing electrical power from said heating element.

12. A pressing iron as set forth in claim 11 wherein said handle includes an outer wall portion, and wherein said antenna is comprised of an electrically conductive member that is disposed beneath said outer wall portion for being capacitively coupled to the user's hand.

13. A pressing iron as set forth in claim 12 wherein said electrically conductive member has a shape which substantially conforms to an inner surface of said outer wall.

14. A pressing iron as set forth in claim 4, and further including a power supply means for converting AC electrical power to a DC potential that is referenced to a circuit ground for powering at least said circuit means, wherein said AC electrical power is supplied to said pressing iron through an AC main having two lines, wherein one line is an AC hot line and wherein one line is an AC neutral line, wherein said power supply means includes a half wave rectifier diode, and a dropping resistor, and wherein said half wave rectifier diode is connected in one of said AC main lines and in series between said AC main and said circuit ground such that a detectable signal is input to said circuit means from said antenna regardless of a polarization of said two lines of said AC main and said resistor is connected in said other of said AC main lines.

15. A pressing iron, comprise:
   a sole plate;
   an electrically powered heating element that is thermally coupled to said sole plate for heating said sole plate to a desired temperature; and
   a handle portion adapted for being held by a user of the pressing iron, said handle portion including,
   means for sensing a proximity of the user to the handle portion and for removing electrical power from said heating element after a predetermined period of not sensing the proximity of the user to the handle portion, wherein said sensing and removing means operates without regard for a motion of said pressing iron and without regard for an orientation of said pressing iron, said means for sensing and removing includes an antenna for coupling a displacement current between the user and said antenna when the user is in proximity to the handle portion, said antenna having an output;
   circuit means having an input coupled to said output of said antenna, said circuit means generating an output signal at an output thereof in response to the coupling of the displacement current between the user and said antenna, said antenna being disposed for being capacitively coupled to the user's hand when the user's hand is in proximity to the handle portion, said output signal of said circuit means is an oscillatory signal having a frequency equal to an AC line power frequency signal.

16. An electrical appliance as set forth in claim 15 wherein said means for switching and removing further includes switching means having an input coupled to said output of said circuit means, said switching means being responsive to said circuit means generating said output signal for being switched from a first state to a second state for applying electrical power to said heating element, said switching means further being responsive to said circuit means ceasing to generate said output signal for being switched from the second state to the first state for removing electrical power from said heating element, wherein said switching means includes means for delaying the switching from the second state to the first state for a predetermined period of time after said circuit means ceases to generate said output signal.

17. A proximity sensor for use in an electrically operated appliance, the proximity sensor including:
   an antenna for coupling a displacement current from a user of the appliance, said antenna having an output;
   circuit means having an input coupled to said output of said antenna, said circuit means generating an output signal at an output thereof in response to a reception of the displacement current; and
   power supply means for converting AC electrical power to a DC potential that is referenced to a circuit ground for powering at least said circuit means, wherein said AC electrical power is supplied to said appliance through an AC main having two lines, wherein one line is an AC hot line and wherein one line is an AC neutral line, wherein said power supply means includes a half wave rectifier diode, and a power dropping resistor and wherein said half wave rectifier diode is connected in one of said AC main lines in series between said AC main and said circuit ground such that a detectable signal is input to said circuit means from said antenna recess of a polarization of said two lines of said AC main and lid resistor is connected in said other of said AC main lines.

* * * * *